(12) United States Patent
Hebig et al.

(10) Patent No.: US 8,467,261 B2
(45) Date of Patent: Jun. 18, 2013

(54) IMPLEMENTING SMART SWITCHED DECOUPLING CAPACITORS TO EFFICIENTLY REDUCE POWER SUPPLY NOISE

(75) Inventors: Travis Reynold Hebig, Rochester, MN (US); David Paul Paulsen, Dodge Center, MN (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 12/833,105

(22) Filed: Jul. 9, 2010

(65) Prior Publication Data
US 2012/0008443 A1  Jan. 12, 2012

(51) Int. Cl.
*G11C 5/14* (2006.01)
(52) U.S. Cl.
USPC ........... 365/229; 365/203; 365/149; 327/535; 716/106
(58) Field of Classification Search
USPC ............ 365/229, 203, 149; 327/535; 716/106
See application file for complete search history.

(56) References Cited

U.S. PATENT DOCUMENTS

| | | | |
|---|---|---|---|
| 6,337,824 B1 * | 1/2002 | Kono et al. | 365/207 |
| 2002/0095647 A1 * | 7/2002 | Bernstein et al. | 716/10 |
| 2010/0226194 A1 * | 9/2010 | Huang | 365/229 |
| 2012/0002334 A1 * | 1/2012 | Kosonocky et al. | 361/56 |

OTHER PUBLICATIONS

Xiongfei Meng, "An Improved Active Decoupling Capacitor for "Hot Spot" Supply Noise Reduction in ASIC Designs", IEEE Jornal of Solid-State Circuits, pp. 584-593, vol. 44, No. 2, Feb. 2009.
Jie Gu et al., "A Switched Decoupling Capacitor Circuit for On-Chip Supply Resonance Damping", 2007 Symposium on VLSI Circuits Digest of Technical Papers, pp. 126-127, Feb. 2010.

* cited by examiner

Primary Examiner — Toan Le
(74) Attorney, Agent, or Firm — Joan Pennington

(57) ABSTRACT

A method and circuit are provided for implementing smart switched decoupling capacitors to efficiently reduce power supply noise in a logic circuit, and a design structure on which the subject circuit resides. The logic circuit includes a logic macro, a high-current event control signal activating a logic function, and a switched decoupling capacitor circuit integrated within the logic macro. The switched decoupling capacitor circuit uses the high-current event control signal to control capacitor switching to discharge to a voltage supply rail responsive to activating the logic function, and to charge the capacitors.

17 Claims, 3 Drawing Sheets

PRIOR ART

IMPLEMENTING SMART SWITCHED DECOUPLING CAPACITORS TO EFFICIENTLY REDUCE POWER SUPPLY NOISE

FIELD OF THE INVENTION

The present invention relates generally to the data processing field, and more particularly, relates to a method and circuit for implementing smart switched decoupling capacitors to efficiently reduce power supply noise in a logic circuit with a high-current event control signal, such as a Static Random Access Memory (SRAM) circuit, Dynamic Random Access Memory (DRAM) circuit, or other dynamic logic circuit, and a design structure on which the subject circuit resides.

DESCRIPTION OF THE RELATED ART

As technology nodes progress, decoupling capacitors are consuming a progressively larger portion of chip area. Switched decoupling capacitors are becoming a popular method to limit the area consumed by decoupling capacitance and improve the effectiveness of the decoupling capacitance at reducing power supply droop.

The basic principle of switched decoupling capacitors can be understood as follows. Two capacitors are initially connected in parallel storing the maximum amount of charge and serving as conventional decoupling capacitors. Then, when a supply droop greater than a specific threshold is detected the decoupling capacitors switch to be connected in series, which dumps charge onto the supply network.

FIG. 1 illustrates an integrated circuit chip including a prior art switched decoupling capacitor arrangement 100 implemented on a semiconductor integrated circuit chip. The switched decoupling capacitor arrangement 100 includes a reference voltage generator 102 and a comparator 104 coupled to the switched decoupling capacitors 106. The reference voltage generator 102 and the comparator 104 are used to control the operation of the switched decoupling capacitors 106 with the comparator applying an input labeled STORE-_DUMP_B to switched decoupling capacitors 106. The switched decoupling capacitors 106 are provided on the chip separated from logic macros on the chip, such as a logic macro or SRAM macro 108. The reference voltage generator 102 and comparator 104 typically are high-power and high-area consuming circuits. In operation, the comparator 104 only reacts when it sees changes in the power grid voltage, which causes a lag between when the extra charge is needed and when the capacitors 106 actually dump the charge.

In general, current prior art switched decoupling capacitor schemes have significant drawbacks. Known switched decoupling capacitor arrangements typically use high-overhead circuits to detect the power supply noise and control the switched decoupling capacitors.

A need exists for an effective and efficient mechanism for implementing smart switched decoupling capacitors to efficiently reduce power supply noise.

SUMMARY OF THE INVENTION

Principal aspects of the present invention are to provide a method and circuit for implementing smart switched decoupling capacitors to efficiently reduce power supply noise in a logic circuit with a high-current event control signal, such as a Static Random Access Memory (SRAM) circuit, Dynamic Random Access Memory (DRAM) circuit, or other dynamic logic circuit, and a design structure on which the subject circuit resides. Other important aspects of the present invention are to provide such method, circuitry and design structure substantially without negative effect and that overcome many of the disadvantages of prior art arrangements.

In brief, a method and circuit are provided for implementing smart switched decoupling capacitors to efficiently reduce power supply noise in a logic circuit, and a design structure on which the subject circuit resides. The logic circuit includes a logic macro, a high-current event control signal activating a logic function, and a switched decoupling capacitor circuit integrated within the logic macro. The switched decoupling capacitor circuit uses the high-current event control signal to control capacitor switching to discharge to a voltage supply rail responsive to activating the logic function, and to charge the capacitors.

In accordance with features of the invention, the switched decoupling capacitor circuit includes a pair of capacitors, and a plurality of switches. The high-current event control signal is applied to operatively control the plurality of switches to connect the capacitors in series to discharge to a voltage supply rail responsive to activating the logic function. A pulse generator is used to tune the amount of time the capacitors are connected in series. The high-current event control signal is applied to operatively control the plurality of switches to connect the capacitors in parallel to charge the capacitors. The switched decoupling capacitor circuit includes a resistor for limiting charging current to the capacitors.

In accordance with features of the invention, the switched decoupling capacitor circuit reduces the power rail noise introduced by operation of the logic macro, including SRAM macros, without significantly increasing power consumption or design complexity of the logic macro or the SRAM macro.

In accordance with features of the invention, the amount of decoupling capacitance required in nanometer scale technologies is reduced; as compared to prior art on-chip decoupling capacitor arrangements. The logic circuit with the switched decoupling circuit of the invention eliminates the need for high-overhead circuits to detect the power supply noise and control the switched decoupling capacitors. The logic circuit with the switched decoupling circuit of the invention eliminates the use of the reference voltage generator and the analog voltage comparator, that otherwise consume large amounts of power in prior art on-chip decoupling capacitor arrangements.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing smart switched decoupling capacitors to efficiently reduce power supply noise in a logic circuit. The logic circuit with the switched decoupling circuit of the invention eliminates the need for a reference voltage generator and an analog voltage comparator, which are high-overhead circuits typically used to detect power supply noise and control the switched decoupling capacitors in prior art on-chip decoupling capacitor arrangements.

Figure 2:
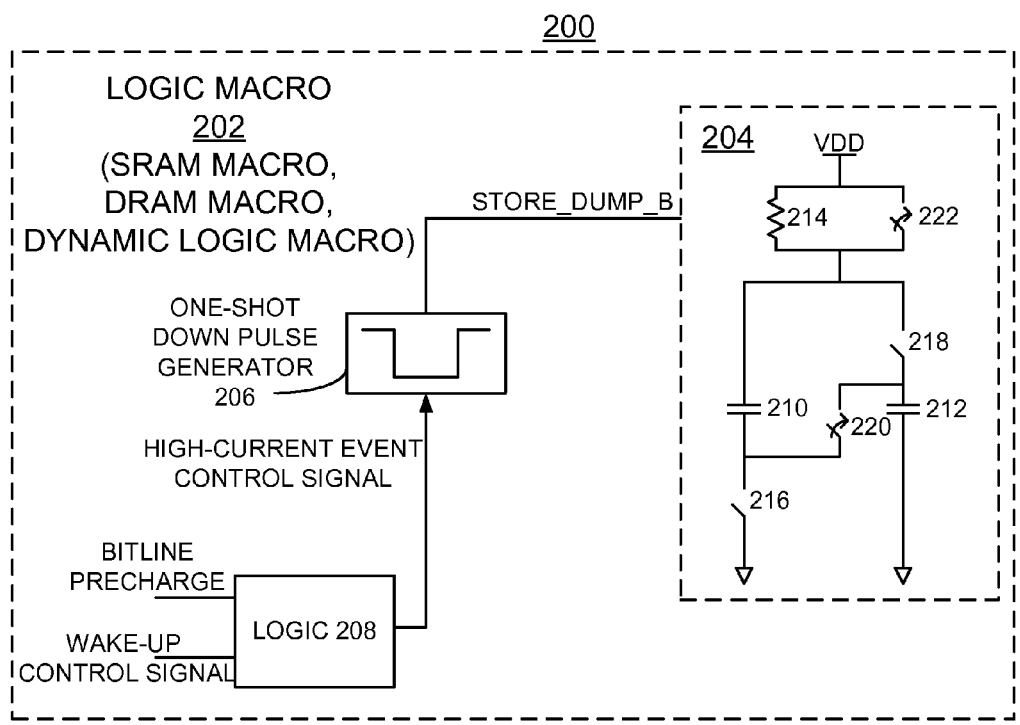
FIG. 2 is a schematic diagram of an exemplary circuit for implementing smart switched decoupling capacitors to efficiently reduce power supply noise in a logic circuit with a high-current event control signal in accordance with the preferred embodiment.

Having reference now to the drawings, in FIG. 2, there is shown an exemplary circuit for implementing smart switched decoupling capacitors to efficiently reduce power supply noise in a logic circuit with a high-current event control signal in accordance with the preferred embodiment generally designated by the reference character 200 in accordance with the preferred embodiment. Circuit 200 includes a logic macro 202, such as an SRAM macro, DRAM macro or other dynamic logic macro 202. For example, the SRAM macro 202 is a collection of static memory elements arranged in rows and columns, and associated control circuitry for reading and writing addressable subsets of those memory elements.

In accordance with features of the invention, the logic macro 202 or SRAM macro, DRAM macro or other dynamic logic macro 202 includes a switched decoupling capacitor circuit 204 integrated within the logic macro 202. The logic macro 202 includes an internal control signal or a high-current event control signal for activating a logic function that is used to control capacitor switching in the switched decoupling capacitor circuit 204.

As shown in FIG. 2, the high-current event control signal is applied to a one-shot down pulse generator 206 that provides a control input to the switched decoupling capacitor circuit 204 indicated STORE_DUMP_B. As shown, circuit 200 includes a two input logic block 208 receiving a bitline precharge input and a wake-up control signal, and provides an output high-current event control signal applied to the one-shot down pulse generator 206.

In accordance with features of the invention, a large dynamic logic block 202, such as an SRAM macro, DRAM macro or other dynamic logic macro 202 introduces a large amount of power grid noise due to their large current demands during reads, writes, and waking up from sleep modes. The present invention integrates and controls the switched decoupling capacitor circuit 204 within the logic macro 202 to substantially eliminate the power supply droop that would be traditionally seen when performing high current operations. The switched decoupling capacitor circuit 204 reduces the power rail noise introduced by operation of the logic macro 202, without significantly increasing power consumption or design complexity of the logic macro.

The switched decoupling capacitor circuit 204 includes a pair of capacitors 210, 212, a resistor 214, and a plurality of switches 216, 218, 220, and 222. For example, switches 216, 218, 220, 222 are implemented, for example, with P-channel field effect transistors (PFETs). The switched decoupling capacitors 210, 212 are internally timed and controlled based on the operation of the logic macro 202.

Certain operations are known to draw high amounts of current and typically cause power supply droop. Such operations include precharging bitlines and waking up from sleep mode. When such an operation is initiated, an internally timed signal STORE_DUMP_B is sent to the switched decoupling capacitor circuit 204 that switches the switched decoupling capacitors 210, 212 from a parallel to a series connection. This dumps charge onto the power grid VDD that is used to supply the current needed for the high current event operation. The switched decoupling capacitor circuit 204 eliminates the power supply droop that would be traditionally seen when performing these high current operations. Then, the switched decoupling capacitors 210, 212 are switched back to parallel for maximum charge storage and to be charged slowly through the resistor 214. The time spent in series connected mode and the time required to re-charge the switched decoupling capacitors 210, 212 are both tunable for the specific application.

With the logic macro 202, circuit 204 can be implemented with generally low overhead. The switches 216, 218, 220, and 222 can be implemented by approximately 2 µm width PFETs and the capacitors 210, 212 can be implemented by, for example, deep trench capacitors. The resistor 214 is implemented, for example by a weak FET device.

Operation of the circuit 200 may be understood as follows. When the bitline precharge signal goes low, the bitlines are precharged drawing large amounts of current, and when waking up from a sleep mode, which is a high-current operation, the output high-current event control signal of the logic block 208 activates the one-shot down pulse generator 206. When the high-current event control signal is activated, the SIGNAL STORE_DUMP_B goes low, causing the switches 220, 222 to close and causes the switches 216, 218 to open. This connects the capacitors 210, 212 in series and dumps charge onto the power supply grid VDD. The one shot down pulse generator 204 is used to tune the amount of time that the decoupling capacitors 210, 212 are connected in series. When the signal STORE_DUMP_B goes high, the switches 216, 218 close and switches 220, 222 open. The resistor 214 is used to re-charge the parallel connected capacitors slowly. This connects the capacitors 210, 212 in parallel and charges them slowly through the resistor 214.

Figure 3:
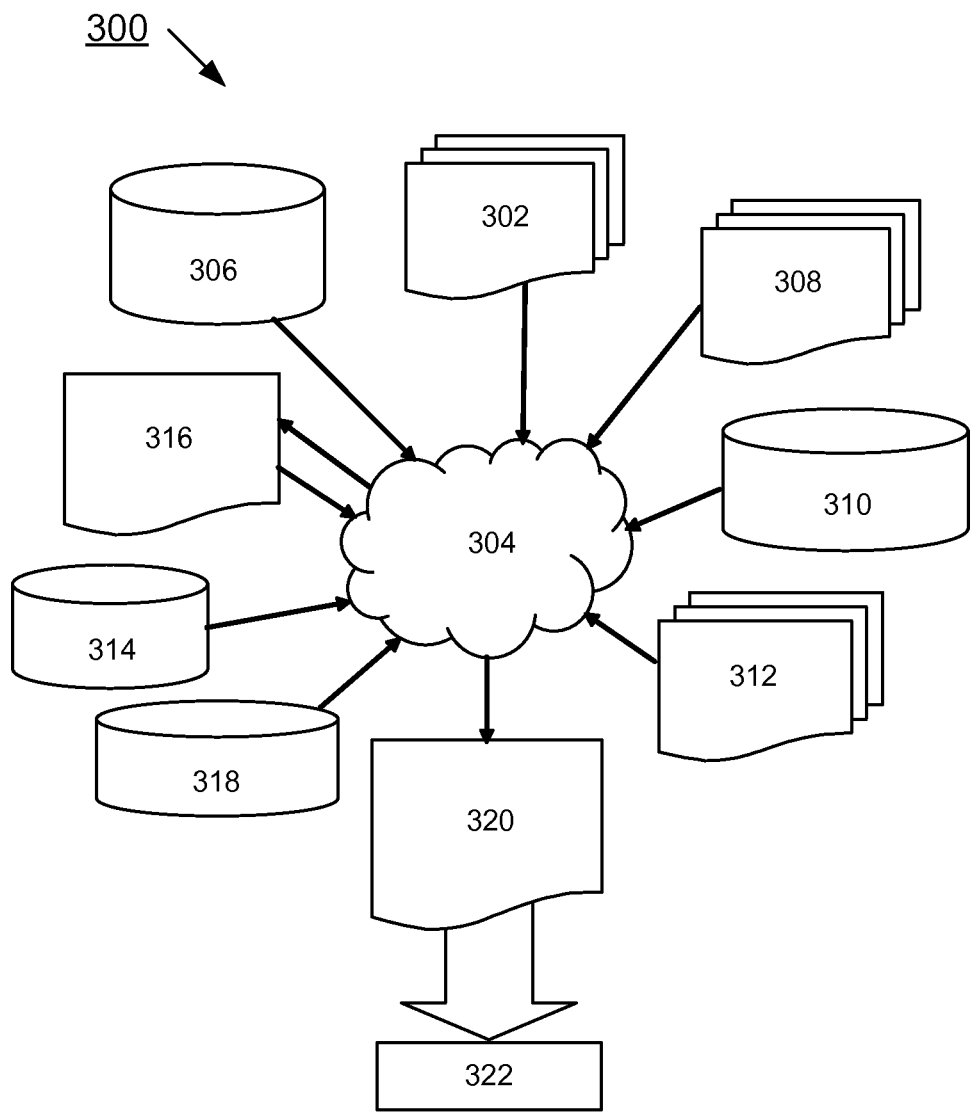
FIG. 3 is a flow diagram of a design process used in semiconductor design, manufacturing, and/or test.

FIG. 3 shows a block diagram of an example design flow 300 that may be used for circuit 200 described herein. Design flow 300 may vary depending on the type of IC being designed. For example, a design flow 300 for building an application specific IC (ASIC) may differ from a design flow 300 for designing a standard component. Design structure 302 is preferably an input to a design process 304 and may come from an IP provider, a core developer, or other design company or may be generated by the operator of the design flow, or from other sources. Design structure 302 comprises circuit 200 in the form of schematics or HDL, a hardware-description language, for example, Verilog, VHDL, C, and the like. Design structure 302 may be contained on one or more machine readable medium. For example, design structure 302 may be a text file or a graphical representation of circuit 200. Design process 304 preferably synthesizes, or translates, circuit 200 into a netlist 306, where netlist 306 is, for example, a list of wires, transistors, logic gates, control circuits, I/O, models, etc. that describes the connections to other elements and circuits in an integrated circuit design and recorded on at least one of machine readable medium. This may be an iterative process in which netlist 306 is resynthesized one or more times depending on design specifications and parameters for the circuits.

Design process 304 may include using a variety of inputs; for example, inputs from library elements 308 which may house a set of commonly used elements, circuits, and devices, including models, layouts, and symbolic representations, for a given manufacturing technology, such as different technology nodes, 32 nm, 45 nm, 90 nm, and the like, design specifications 310, characterization data 312, verification data 314, design rules 316, and test data files 318, which may include test patterns and other testing information. Design process 304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 304 without deviating from the scope and spirit of the invention. The design structure of the invention is not limited to any specific design flow.

Figure 1:
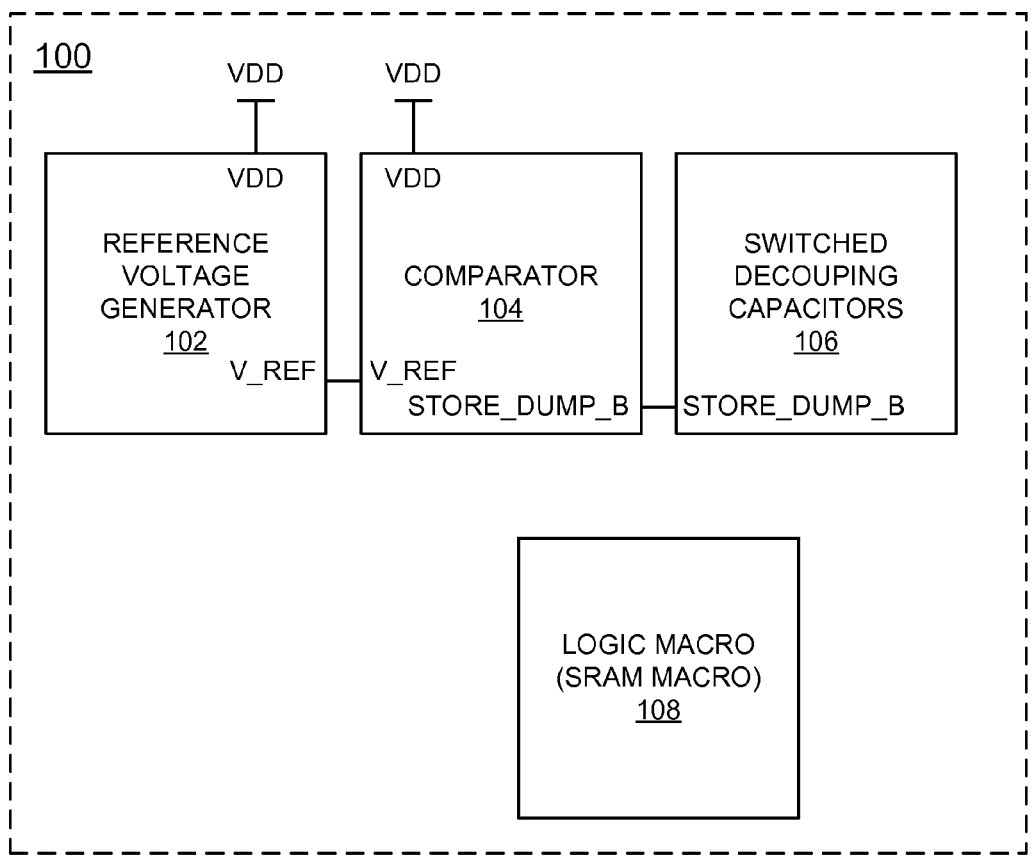
FIG. 1 illustrates a prior art switched decoupling capacitor arrangement.

Design process 304 preferably translates an embodiment of the invention as shown in FIG. 1 along with any additional integrated circuit design or data (if applicable), into a second design structure 320. Design structure 320 resides on a storage medium in a data format used for the exchange of layout data of integrated circuits, for example, information stored in a GDSII (GDS2), GL1, OASIS, or any other suitable format for storing such design structures. Design structure 320 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 320 may then proceed to a stage 322 where, for example, design structure 320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing smart switched decoupling capacitors comprising:
   providing a switched decoupling capacitor circuit integrated within a logic macro including a high-current event gating control signal activating a logic function, and a pair of capacitors, and a plurality of switches coupled to said capacitors; and
   said switched decoupling capacitor circuit, using said high-current event gating control signal to control capacitor switching to discharge to a voltage supply rail responsive to activating the logic function, and to charge from the voltage supply rail.

2. The method as recited in claim 1 includes applying said gating control signal to operatively control the plurality of switches to connect said capacitors in series to discharge to a voltage supply rail responsive to activating the logic function.

3. The method as recited in claim 1 includes applying said gating control signal to operatively control the plurality of switches to connect said capacitors in parallel to charge said capacitors.

4. The method as recited in claim 1 includes providing a resistor for limiting charging current to said capacitors.

5. The method as recited in claim 1 wherein using said high-current event control signal to control capacitor switching includes providing a pulse generator, applying said high-current event control signal to said pulse generator, and applying an output of said pulse generator to said switched decoupling capacitor circuit.

6. The method as recited in claim 1 wherein said logic macro is a Static Random Access Memory (SRAM) macro, and wherein using said high-current event control signal to control capacitor switching includes applying a bitline precharge control signal to said switched decoupling capacitor circuit to control capacitor switching.

7. The method as recited in claim 6 includes applying a wake-up control signal to said switched decoupling capacitor circuit to control capacitor switching.

8. A circuit for implementing smart switched decoupling capacitors comprising:
   a logic macro,
   a high-current event gating control signal activating a logic function within said logic macro;
   a switched decoupling capacitor circuit integrated within a logic macro; said switched decoupling capacitor circuit including a pair of capacitors, and a plurality of switches coupled to said capacitors; and
   said switched decoupling capacitor circuit, using said high-current event gating control signal to control capacitor switching to discharge to a voltage supply rail responsive to activating the logic function, and to charge from the voltage supply rail.

9. The circuit as recited in claim 8 includes said gating control signal being coupled to said plurality of switches to operatively control capacitor switching.

10. The circuit as recited in claim 8 includes a pulse generator, said high-current event control signal being coupled to said pulse generator, and an output of said pulse generator being coupled to said switched decoupling capacitor circuit.

11. The circuit as recited in claim 8 wherein using said high-current event control signal to control capacitor switching includes a bitline precharge control signal being coupled to said switched decoupling capacitor circuit to control capacitor switching.

12. The circuit as recited in claim 8 includes a resistor for limiting charging current from the voltage supply rail to said capacitors.

13. A design structure embodied in a machine readable medium used in a design process, the design structure comprising:
   a circuit tangibly embodied in the machine readable medium used in the design process, said circuit for implementing smart switched decoupling capacitors, said circuit comprising:
   a logic macro,
   a high-current event gating control signal activating a logic function within said logic macro;
   a switched decoupling capacitor circuit integrated within a logic macro; said switched decoupling capacitor circuit including a pair of capacitors, and a plurality of switches coupled to said capacitors; and said gating control signal being coupled to said plurality of switches to operatively control capacitor switching and
   said switched decoupling capacitor circuit, using said high-current event gating control signal to control capacitor switching to discharge to a voltage supply rail responsive to activating the logic function, and to charge from the voltage supply rail, wherein the design structure, when read and used in the manufacture of a semiconductor chip produces a chip comprising said circuit.

14. The design structure of claim 13, wherein the design structure comprises a netlist, which describes said circuit.

15. The design structure of claim 13, wherein the design structure resides on storage medium as a data format used for the exchange of layout data of integrated circuits.

16. The design structure of claim 13, wherein the design structure includes at least one of test data files, characterization data, verification data, or design specifications.

17. The design structure of claim 13, includes a pulse generator, said high-current event control signal being coupled to said pulse generator, and an output of said pulse generator being coupled to said switched decoupling capacitor circuit.

* * * * *